(12) United States Patent
Arai et al.

(10) Patent No.: US 6,310,462 B1
(45) Date of Patent: Oct. 30, 2001

(54) RESIDUAL CAPACITY MEASUREMENT SYSTEM FOR BATTERY

(75) Inventors: Youichi Arai; Makoto Ishigami, both of Shizuoka-ken (JP)

(73) Assignee: Yazaki Corporation, Tokyo (JP)

(*) Notice: Subject to any disclaimer, the term of this patent is extended or adjusted under 35 U.S.C. 154(b) by 0 days.

(21) Appl. No.: 09/604,059

(22) Filed: Jun. 26, 2000

(30) Foreign Application Priority Data

Jun. 25, 1999 (JP) .................................................. 11-180623

(51) Int. Cl.[7] .................................................. H01M 10/46
(52) U.S. Cl. .................................................. 320/132
(58) Field of Search .................................. 320/132, 149; 324/426, 427, 433; 340/635, 636

(56) References Cited

U.S. PATENT DOCUMENTS

| 5,539,318 | 7/1996 | Sasaki . |
| 5,872,453 | 2/1999 | Shimoyama et al. . |
| 5,898,292 | 4/1999 | Takemoto et al. . |

FOREIGN PATENT DOCUMENTS

| 8-62310 | 3/1996 | (JP) . |
| 8-240647 | 9/1996 | (JP) . |
| 8-278351 | 10/1996 | (JP) . |
| 9-318717 | 12/1997 | (JP) . |
| 10-24670 | 9/1998 | (JP) . |

*Primary Examiner*—Edward H. Tso
(74) *Attorney, Agent, or Firm*—Finnegan, Henderson, Farabow, Garrett & Dunner, L.L.P.

(57) ABSTRACT

After an initial capacity setter (13) sets the initial residual capacity immediately after the application of power as 100%, a full-charge voltage corrector (14) sets the full-charge voltage as the estimation voltage $Vn0$ of a battery (3) immediately after a load change, this full-charge voltage Vno being used to determine the residual capacity SOC immediately after the change. After charging is interrupted midway, if the load is changed, a full-charge voltage estimator estimates the full-charge voltage responsive to the estimation voltage immediately after the load change, this estimated full-charge voltage being used to determine the residual capacity.

7 Claims, 12 Drawing Sheets

RESIDUAL CAPACITY MEASUREMENT SYSTEM FOR BATTERY

BACKGROUND OF THE INVENTION

1. Field of the Invention

The present invention relates to a system for performing analysis, calculation, computation, determination, detection, estimation, measurement and/or prediction (hereinafter collectively referred to as "detection") of the state of charge (hereinafter sometimes abbreviated as "SOC") of a battery, in terms of a residual capacity, by using a saturation or full-charge voltage of the battery.

2. Description of the Related Art

The accurate estimation of the residual capacity is an important capability in an electrical vehicle which runs on battery power.

For example, in a battery residual capacity detection system disclosed in Japanese Patent Application Laid-Open Publication No.8-278351, making use of ease of calculation, a battery controller determines the residual capacity (SOC) of a battery immediately after an ignition switch is turned on, using the following expression (1), and displays this value.

$$SOC=[(Vn^2-Ve^2)]/(Vs^2-Ve^2)]\times 100\% \quad (1),$$

where Vn is an estimation voltage of the battery, Ve is a discharge-end voltage of the battery, and Vs is a full-charge voltage of the battery.

Generally, in the electrical vehicle, the battery is fully charged after a travel or trip, such as when in a guarage.

During operation of an electrical vehicle, the battery has its terminal voltage and discharge current providing their time-dependent values, of which prescribed numbers are collected on associated axes of a voltage vs. current coordinate system, where they are averaged to provide a set of corresponding component data. When a prescribed number of such sets of data have been accumulated, a correlation between their component data is calculated to determine its coefficient r, and an associated regressoin line is defined as an expression for linear approximation, such that Y=aX+b, where Y and X are values on the axes of the coordinate system, and "a" and "b" are constants. As the coefficient r indicates a significant negative correlation, the regression line is determined by applying the method of least squares to calculation of the constants "a" and "b". A current value of the battery voltage Vn is estimated by subsituting a reference current Io into the expression of linear approximation.

Then, the estimation voltage Vn is substituted into the expression (1) to determine the residual capacity of the battery in terms of a current SOC during vehicle operation.

As shown in FIG. 11 for relatively high ambient temperatures, the residual capacity is calculated to be displayed as a 100% at the startup of operation (switching of ignition to on and start of driving) after a full charge. As the vehicle is driven, the residual capacity gradually decreases along a given characteristic curve.

At relatively low temperatures, however, the battery capacity becomes smaller than in a high-temperature range.

Thus, as shown in FIG. 12, in contrast to the residual capacity characteristic in the high temperature range (for example, on a summer day), it so happens in a low temperature range (for example, during the winter) that, even though the battery is fully charged, the battery voltage remains short, with a failure to display a matured residual capacity.

Under this condition, because the battery is apparently not fully charged, charging tends to be kept continued. Further, there will not be displayed an initial 100% residual capacity, and the charging might be kept long, resulting in possible deterioration of the battery.

Even if a correction is made for calculation to display an initially 100% residual capacity after a full charge in a low temperature range, a full-charge voltage Vs to be used therefor upon completion of an associated full charge is to be used as a constant in the expression (1). Thus, at low temperatures in the range, calculated values of the residual capacity describe another tendency than a gradual drop from the 100%, as illustrated by a residual capacity characteristic A in FIG. 13.

For example, with a full charge at a low temperature, the characteristic A would indicate a gradual decrease from a 80% residual capacity, when driving. Initially after the full charge, however, there would be a sudden decrease (a) from a 100% to lower than the 80% (for example, to a 70%), before entering the gradual decrease.

At low temperatures in the ragne, therefore, even if the battery has a full charge, the displayed residual capacity will be lower, so that the driver will think that the drivable distance is shorter than it actually is.

Further, even while driving, the residual capacity at part of the characteristic curve A subsequent from the sudden decrease (a) might be by calculation based on the constant voltage Vn, thus having wrong values displayed.

SUMMARY OF THE INVENTION

The present invention has been made with such points in view. It therefore is an object of the present invention to provide a residual capacity detection system for a battery enabling a residual battery capacity of 100% to be detected immediately after a full charge, irrespective of ambient temperatures to be high or low. It is preferable if like detection can be maintained as well during subsequent operation.

An aspect of the present invention to achieve the object is a battery residual capacity detection system having a calculator for estimating the battery voltage from a linear approximation representing a relationship between a terminal voltage of the battery, detected by a voltage detector and a current flowing in a load from the battery, detected by a current sensor, and a reference current, and determining the residual capacity of the battery from this estimation voltage, a full-charge voltage, and a discharge-end voltage, the calculator having a full-charge voltage corrector that, immediately after a change in the load, reads the obtained estimation voltage, changes the full-charge voltage to the estimation voltage, determines the residual capacity.

By adopting this configuration, the full-charge voltage is the estimation voltage of the battery immediately after a change in the load, the subsequent residual capacity being calculated in accordance with this full-charge voltage (battery voltage estimated immediately after a change in the load). Thus, even under residual capacity variation related to the temperature, the residual capacity is determined using the full-charge voltage at the time of the change, resulting in a determination of the residual capacity that takes into consideration the influence of temperature.

The present invention also has a full-charge voltage estimator. Immediately after a change occurs in the load, the full-charge voltage estimator deletes the current full-charge voltage setting, then reads the estimation voltage obtained immediately after the change and the maximum set maximum residual capacity, and using the maximum residual capacity, the estimation voltage obtained immediately after the change in the load, and the discharge-end voltage to estimate and set the new full-charge voltage.

For this reason, after charging is ended midway, the estimated battery voltage immediately after the electrical vehicle motor is driven and the load changes is used to estimate the full-charge voltage corresponding to that estimation voltage, this estimated full-charge voltage being used to determine the residual capacity.

BRIEF DESCRIPTIONS OF THE DRAWINGS

The above-noted and other features of the present invention will be apparent from the description of embodiments to follow, taking in combination with the accompanying drawings, of which:

DETAILED DESCRIPTION OF THE PREFERRED EMBODIMENTS

Embodiments of a battery residual capacity detection system according to the present invention are described in detail below, with references being made to relevant accompanying drawings.

Figure 1:
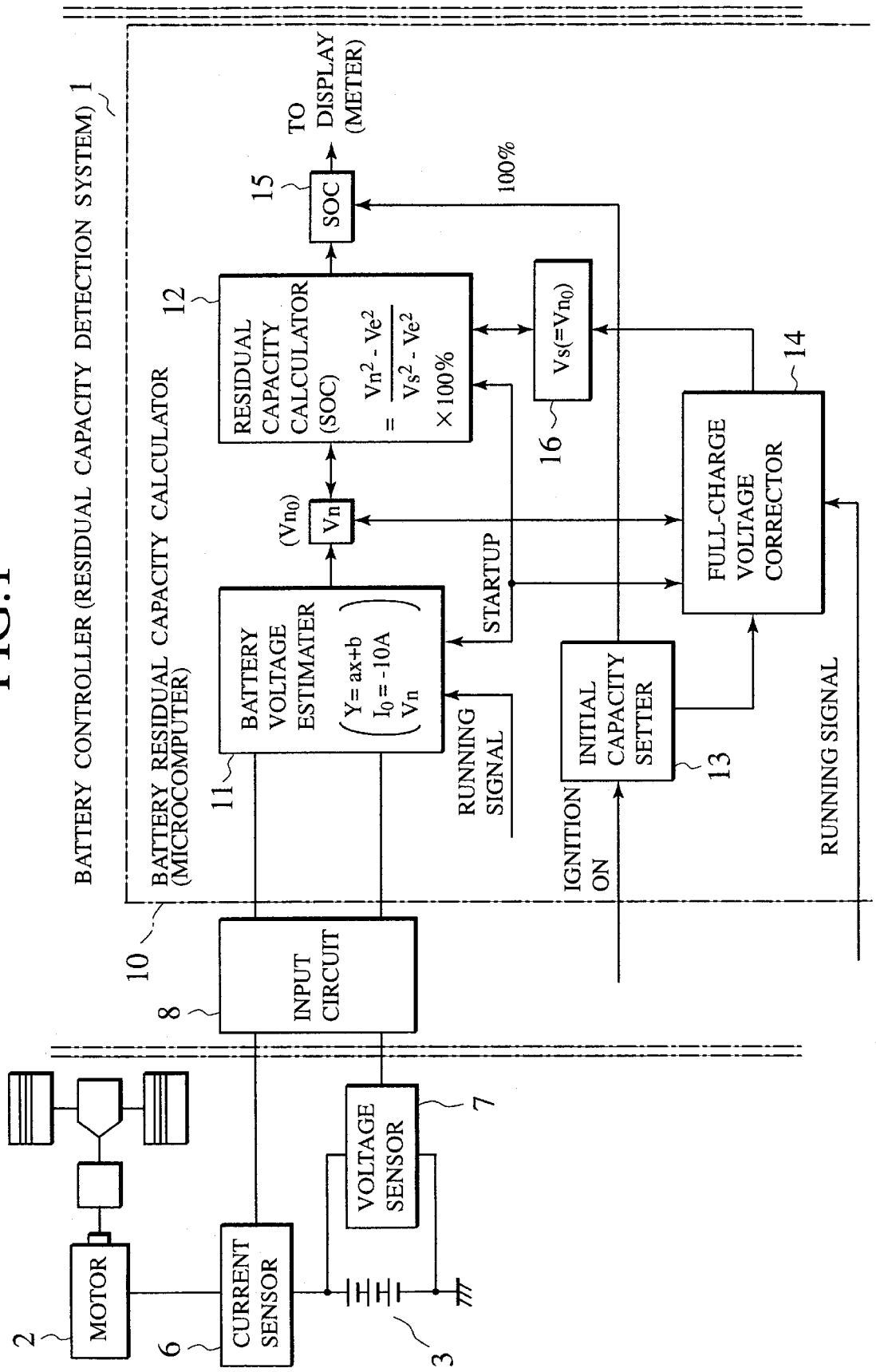
FIG. 1 is a drawing showing the general configuration of a battery residual capacity detection system according to a first embodiment of the present invention immediately after operation is started.

FIG. 1 shows the general configuration of a battery residual capacity detection system according to a first embodiment of the present invention, immediately after the start of operation.

The battery controller 1 shown in FIG. 1 discharges electrical driving power into the motor 2 (alternator) and determines the residual capacity of the battery 3 that is charged by regenerative electrical power from the motor 2.

The battery controller 1 has a input circuit 8 connected to current sensor 6 that detects a discharge current and a full-charge current from the battery 3 and a voltage sensor that detects the voltage of the battery 3, and performs waveshaping of the detected current I and the detected voltage V, and a battery residual capacity calculator 10 (microcomputer) for sampling the current I and the voltage V form the input circuit 8 at a fixed time interval and, for collecting a plurality of averaged data when a prescribed number thereof are collected, and determining the residual capacity.

The battery residual capacity calculator 10, as shown in FIG. 1, has a battery voltage estimator 11, a residual capacity calculator 12, an initial capacity setter 13, and a full-charge voltage corrector 14.

The battery voltage estimator 11 collects and averages a prescribed number of voltage V versus current I values of the battery 3 and, when a prescribed number of averaged data have been collected, determines the correlation coefficient r thereof. If this correlation coefficient r indicates a strong negative correlation, the method of least squares is applied to determine a regression line (linear approximation), and from this linear approximation Y ($Y=aX+B$) and a reference current Io, the current battery voltage Vn is estimated.

Each time the estimation voltage Vn (or Vn0) is determined by the battery voltage estimator 11, the residual capacity calculator 12 reads that estimated battery voltage Vn, a pre-established discharge-end voltage Ve, and a full-charge voltage Vs set by the full-charge voltage corrector 14, to be described later, and determines the residual capacity SOC according to the expression 1, this being stored in an SOC output register 15 and displayed.

With detection of the switch-on of the ignition, the initial residual capacity setter 13 writes the residual capacity after the start of operation into the output register 15, into which the residual capacity is written, as 100% residual capacity, and causes the full-charge voltage corrector 14 to start.

With the running signal input, the input of a estimation voltage Vn0 calculation complete signal immediately after start of operation, and notification of display, of the initial residual capacity immediately after switching the ignition on as 100%, the full-charge voltage corrector 14 clears the register 16, into which is stored the full-charge voltage Vs.

The estimation voltage Vn0 is read, this estimation voltage Vn0 is stored in the register 16 and taken as the full-charge voltage Vs (=Vn0).

Figure 2:
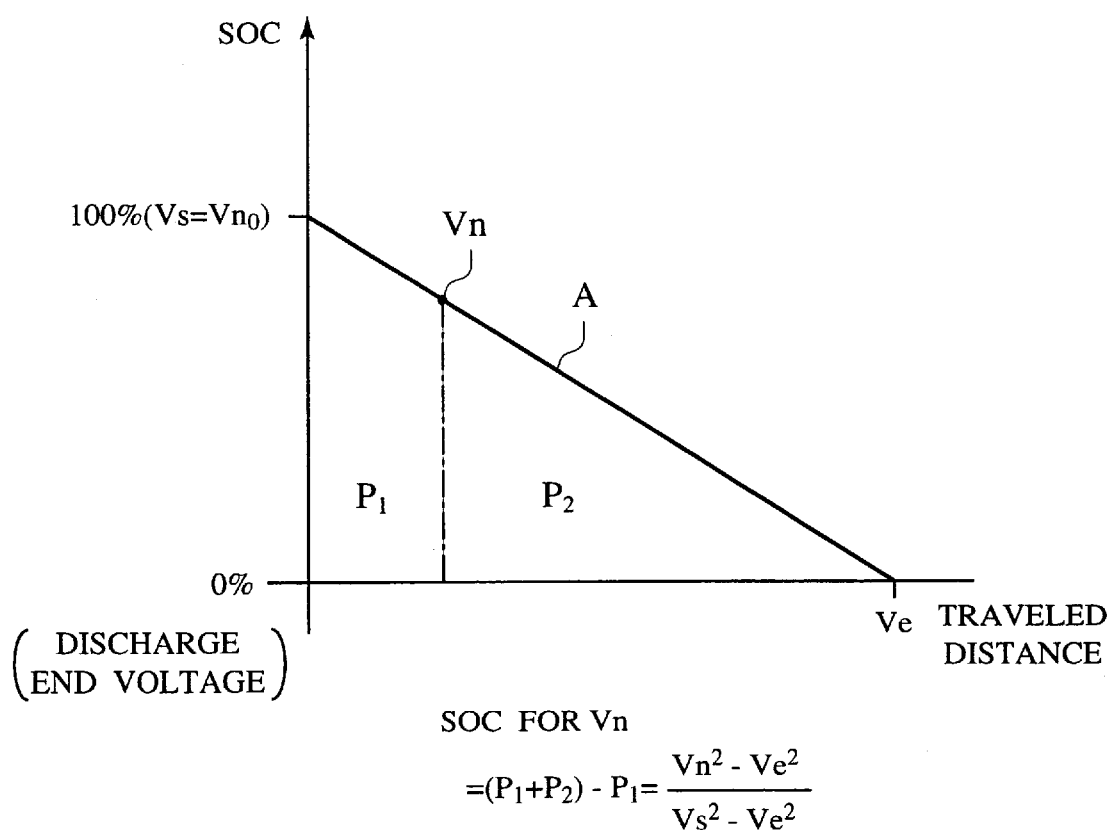
FIG. 2 is a drawing illustrating the concept of the first embodiment.

Thus, as shown in FIG. 2, in the battery residual capacity calculator 10 according to this embodiment, after the completion of a full charge, immediately after the ignition is switched on, after the residual capacity SOC is forcibly displayed as a 100% initial residual capacity, the estimation voltage Vn0 for initial running is determined from a linear approximation Y ($Y=aX+B$) based on a plurality of current I and voltage V values taken as the battery 3 discharges immediately after the start of running. Each time this estimation voltage Vn0 is determined, the current full-charge voltage Vs of the battery is updated to the estimation voltage Vn0.

That is, for a residual capacity at a reference temperature of, for example, 20° C., the full-charge voltage is, for example, 12 V, and the residual capacity at this voltage is generally taken to be 100%. Even if the estimation voltage Vn0 immediately after the ignition is switched on (or immediately after the start of running) is for example 11 V (which would be 90% with respect to the residual capacity at the reference temperature), by taking this 11 V as the current full-charge voltage Vs, the residual capacity is determined using residual capacity characteristics A, which exhibit a linear decrease, eliminating the part of the characteristics in which there is a sudden drop.

The operation of the first embodiment configured as noted above is as follows. This will be described with reference to the flowchart of FIG. 3, which generally illustrates the operation of this embodiment.

Figure 3:
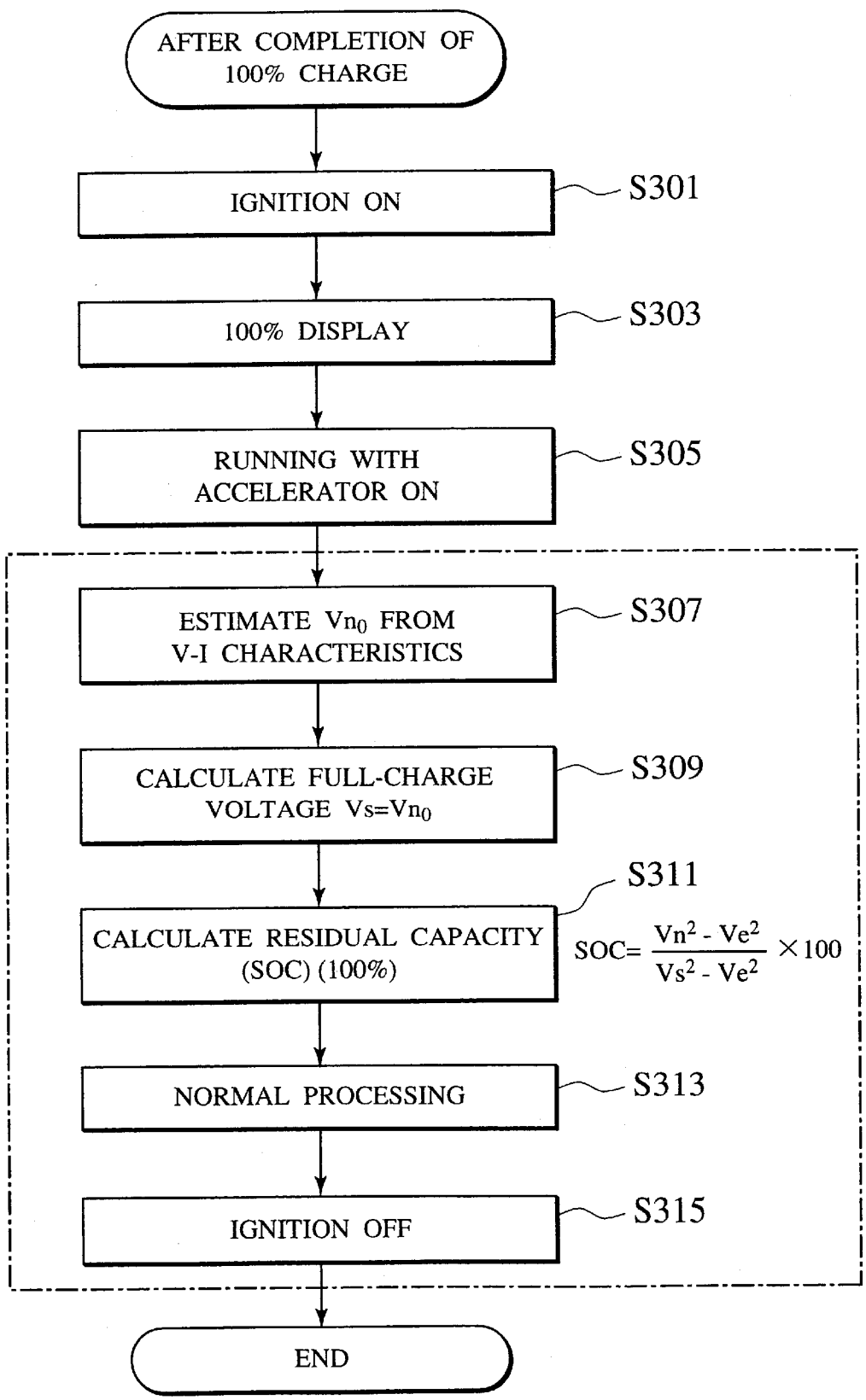
FIG. 3 is a flowchart illustrating the general operation of the first embodiment.

The use cycle of an electrical vehicle is as follows, with reference made to the flowchart of FIG. 3. With the switching on of the ignition (step S301), the initial residual capacity setter 13 of the residual capacity calculator 10 mounted in an electrical vehicle immediately displays the initial residual capacity SOC as 100% (step S303). That is, even if the battery full-charge voltage vary in response to the temperature (high or low), this voltage is ignored, the initial residual capacity immediately after switching the ignition on being taken as 100%.

Next, with running by operation of the accelerator (S305), as the battery capacity decreases, the battery voltage estimator 11 collects and averages a prescribed number of current I and voltage V values and, when a prescribed number of averaged data has been collected, determines the correlation coefficient r therefrom. Next, if the value of r indicates a strong negative correlation, the method of least squares is applied to determine a regression line, and from this linear approximation Y (Y=aX+B) and a reference current Io, the current battery voltage Vn (hereinafter called the estimation voltage Vn0) is estimated (step S307).

That is, at step S307, the current voltage of the battery 3 immediately after start of running is estimated.

The full-charge voltage corrector 14 sets this estimation voltage Vn0 as the full-charge voltage Vs (step S309). That is, the full-charge voltage Vs when the residual capacity SOC immediately after the ignition is switched on (or immediately after the start of running) is not made a constant value, but rather replaced by the estimation voltage Vn0.

Next, the residual capacity calculator 12 uses this full-charge voltage Vs (=Vn0) to determine the residual capacity SOC, using equation 2 (step #311)

$$SOC=[(Vn^2-Ve^2)]/(Vs^2(=Vn0)-Ve^2)]\times 100\% \quad (2),$$

where Vn is the estimated battery voltage, Ve is the discharge-end voltage, and Vs is the full-charge (saturation) voltage.

As shown by equation 2, at step S311, because the full-charge voltage Vs is the estimation voltage Vn, this is displayed as 100%, similar to step S303.

Next, the normal residual capacity calculation is continued until the ignition is switched off (steps S313 and S315).

The normal residual capacity calculation as noted above is that in which, the full-charge voltage Vs set at step S309 (this being the estimation voltage Vn0 immediately after operation startup) is taken as a fixed value in subsequent processing by the residual capacity calculator 12. The battery voltage estimator 11 collects and averages a prescribed number of voltage V and current I values from the input circuit 8 and, when a prescribed number of averaged data have been collected, determines the correlation coefficient r of the data. If the value of r indicates a strong negative correlation, the method of least squares is applied to determine a regression line (linear approximation), and from this linear approximation Y (Y=aX+B) and a reference current Io, the current battery voltage Vn is estimated.

Next, the residual capacity calculator 12 determines the residual capacity SOC during running according to equation 2.

Therefore, because there is no sudden drop in the residual capacity characteristics, even if the temperature drops, it is possible to accurately determine the residual capacity.

Figure 4:
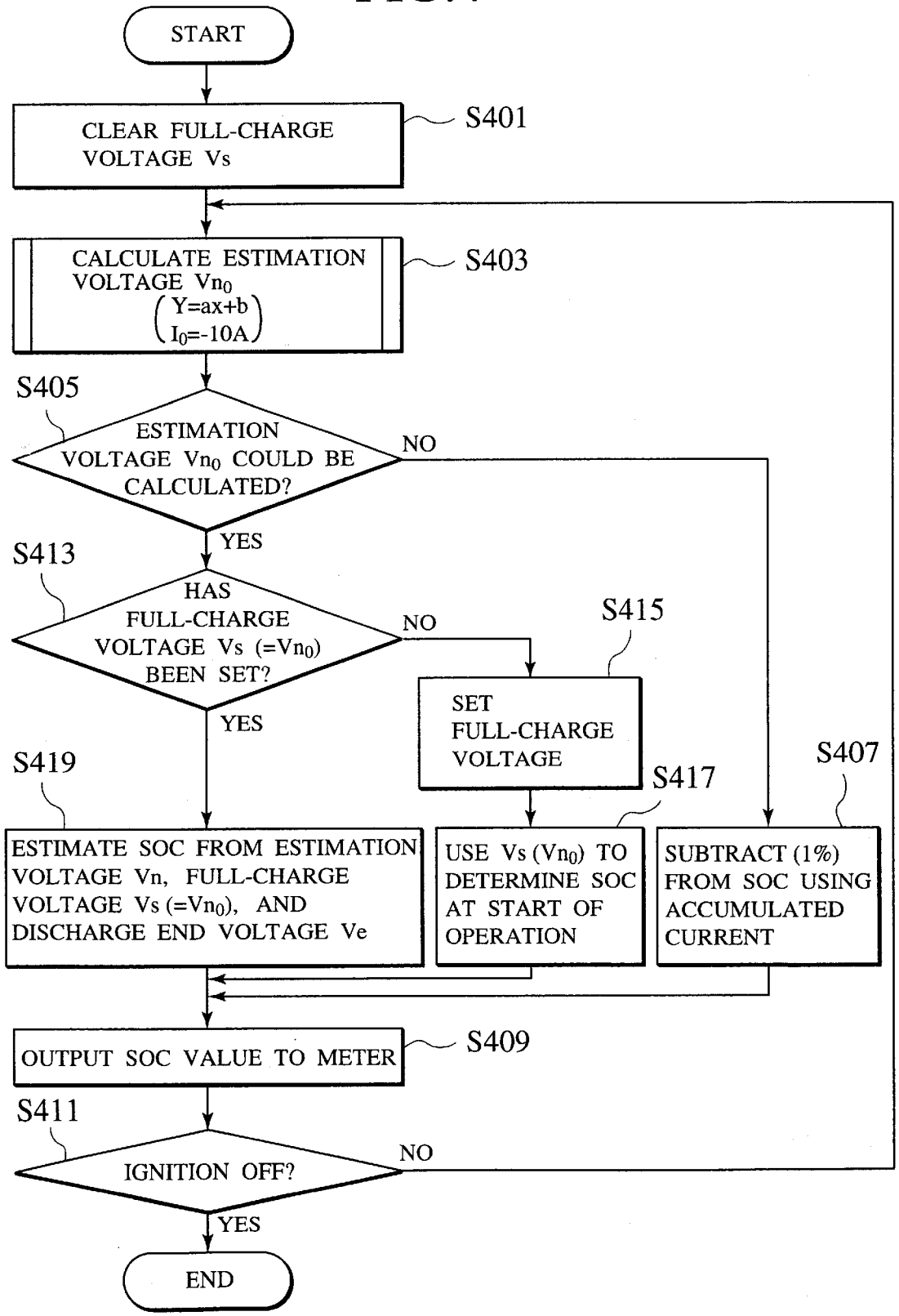
FIG. 4 is a flowchart illustrating in detail the operation of the first embodiment.

The processing of steps S307 through S315 is as follows, referring to the flowchart of FIG. 4.

With the switching on of the ignition, the initial residual capacity is displayed as 100% and, with running under accelerator operation, the full-charge voltage corrector 14 clears the register 16 in which the full-charge voltage Vs is set (step S401).

The battery voltage estimator 11 collects and averages a prescribed number of voltage V and current I values from the input circuit 8 and, when the prescribed number of averaged data have been collected, calculates the correlation coefficient r of the data. Next, if the value of r indicates a strong negative correlation, the method of least squares is applied to determine a regression line, and from this linear approximation Y (Y=aX+B) and a reference current Io, the current battery voltage Vn0 is estimated.

Details of the calculation of the estimation voltage Vn0 are described also in the Japanese Patent Application Laid-Open Publications 8-62310 and 8-240647, and in Japanese Patent Applications 11-147201 and 11-147202 (both not opened).

Next, the full-charge voltage corrector 14 makes a judgment as to whether or not the battery voltage estimator 11 has been able to calculate the estimation voltage Vn0.

At step S405, if the judgment is made that it was not possible to calculate the estimation voltage Vn0, the residual capacity calculator 12 makes a judgment as to whether the accumulated value of current I collected by the battery voltage estimator 11 corresponds to 1% of the capacity (100%) set at step S303 and, if it does correspond to 1%, the residual capacity calculator 12 subtracts from the capacity (100%) set at step S303, taking this value as the residual capacity and setting it into the register 15 (step S407), and displaying this capacity SOC on a meter (step S409).

A reason why the estimation voltage Vn0 cannot be calculated at step S405 is that, in the case of incomplete discharging, such as immediately after the ignition is switched on, there is little change in the voltage and current, and the correlation is weak, making it impossible to calculate the estimation voltage Vn0.

Figure 5:
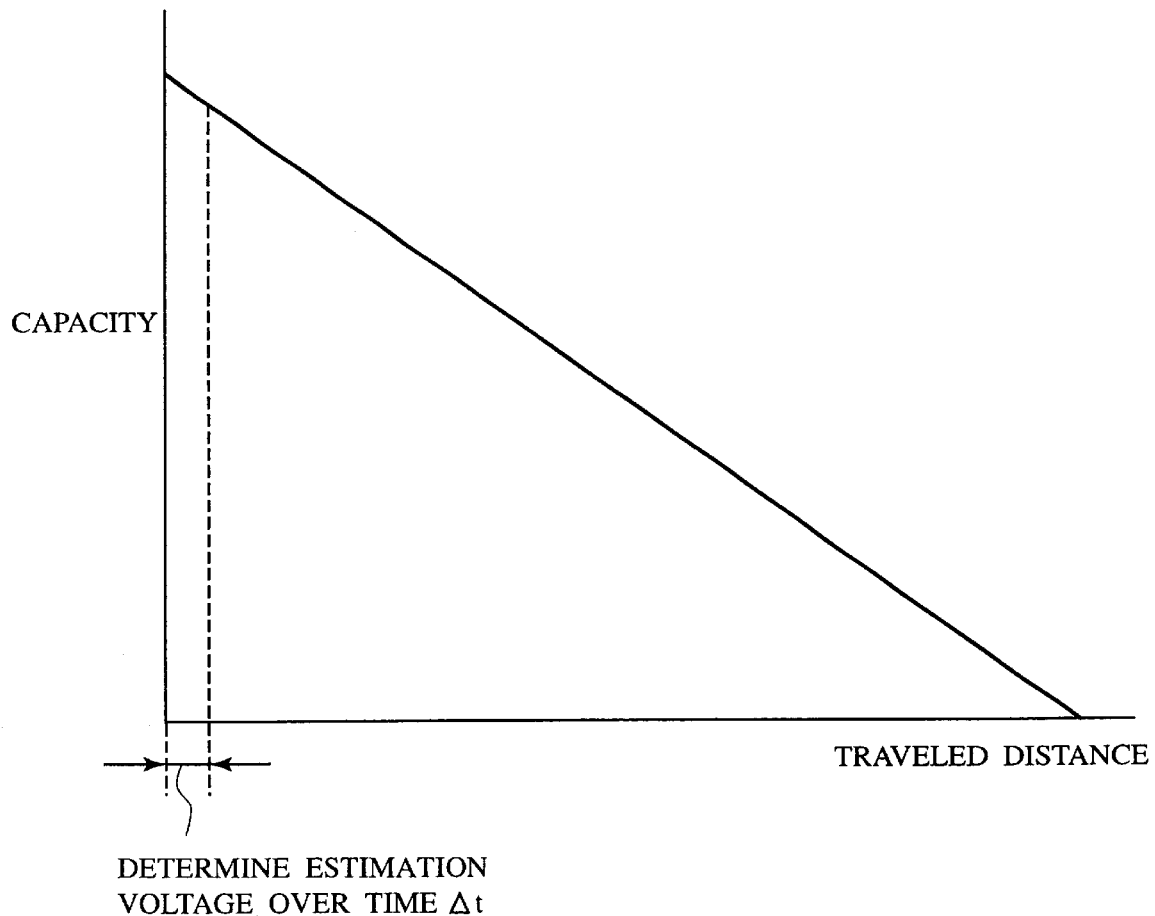
FIG. 5 is a drawing illustrating the specific calculation timing for the estimation voltage in the first embodiment.

That is, as shown in FIG. 5, immediately after the ignition is switched on (or immediately after the start of running), rather than actually determining the estimation voltage Vno immediately, the determination is made after a time Δt has elapsed.

The subtraction of capacity in step S405 is also described in detail in the Japanese Patent Application Laid-Open Publication No. 9-318717.

At step S405, if the full-charge voltage corrector 14 judges that it was possible to calculate the estimation voltage Vn0, a judgment is made as to whether the full-charge voltage Vs has already been written into the register 16.

At step S413, if the judgment is made that the full-charge voltage Vs has not been calculated, the estimation voltage Vn0 calculated at step S403 is set into register 16 as the full-charge voltage Vs, and a full-charge voltage set flag is set (not shown in the drawing) (step S415).

Using this set full-charge voltage Vs (=Vn), the residual capacity calculator 12 uses equation 12 to determine the residual capacity SOC at the beginning of operation (step S417). That is, the residual capacity at the start of operation set into the register 15 at step S417 is set as the 100% data and displayed on the meter.

At step S413, if the judgment is made that, the full-charge voltage corrector, the full-charge voltage set flag being set, has already set the full-charge voltage Vs (=Vn0), because the full-charge voltage Vs (=Vn0) is not thereafter set into the register 16, the battery voltage estimator 11 and residual capacity calculator 12 perform normal residual capacity calculation (step S419).

Figure 6:
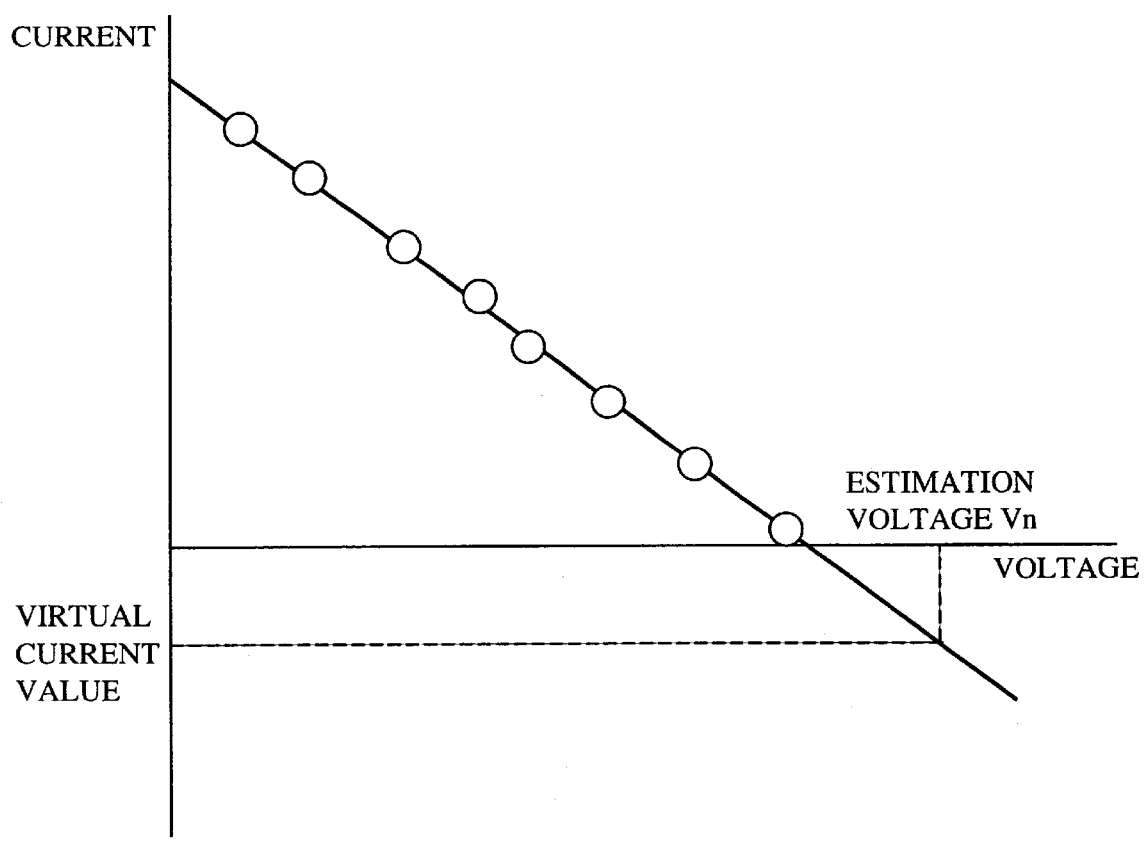
FIG. 6 is drawing illustrating the calculation of the estimation voltage in an embodiment of the present invention.

The normal residual capacity calculation as noted above is that in which the battery voltage estimator 11 collects and averages a prescribed number of voltage V and current I values from the input circuit 8 and, when a prescribed number of averaged data have been collected, determines the correlation coefficient r of the data. If the value of r indicates a strong negative correlation, the method of least squares is applied to determine a regression line (linear approximation) and, as shown in FIG. 6, from this linear approximation Y (Y=aX+B) and a reference current Io, the current battery voltage Vn is estimated.

The residual capacity calculator 12 uses the current estimation voltage Vn determined by the battery voltage estimator 11, the discharge-end voltage Ve, and the full-charge voltage Vs (Vn0) set into the register 16 to determine and display the residual capacity SOC, according to equation 2.

Figure 7A:
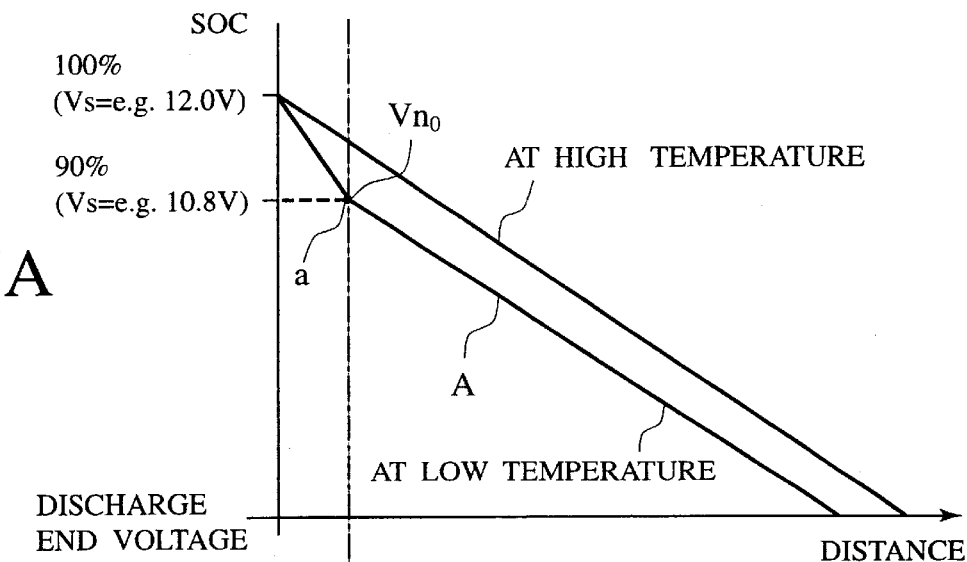
FIG. 7A and FIG. 7B are drawings illustrating the action of the first embodiment.
Figure 7B:
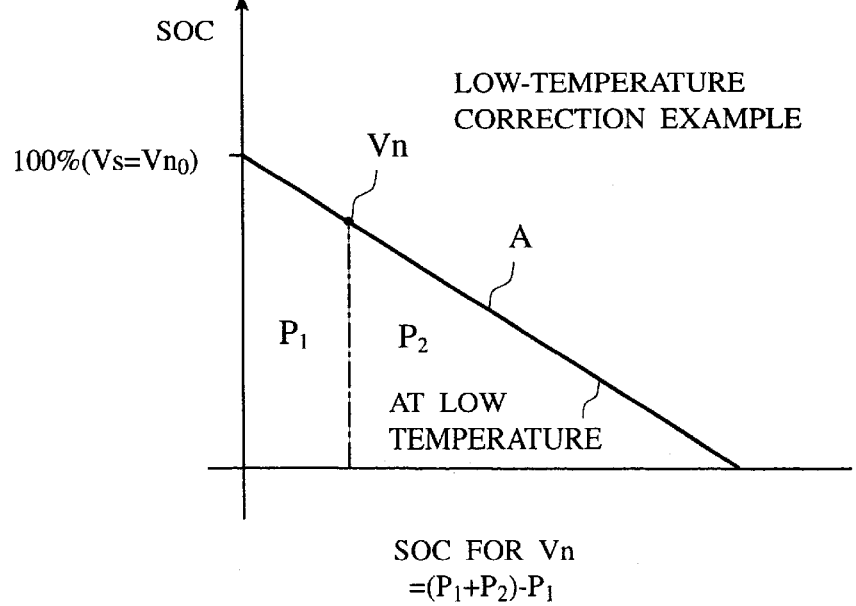

That is, in the first embodiment, as shown in FIG. 7A and FIG. 7B, at a low temperature, in contradistinction with the situation in which the temperature rises (at which there is a normal full-charge voltage, for example, 12.0 V, based on a reference temperature), after completion of a full charge, immediately after the start of operation, the voltage is, for example, 10.8 V, and the residual capacity SOC is displayed as 90% (90% with respect to the residual capacity at the reference temperature). That is, there exists a point a, to which a sudden drop is made, and from this point a the residual capacity characteristics exhibit a gradually linear decrease.

With the first embodiment of the present invention, however, by not fixing the full-charge voltage Vs, but rather taking the estimation voltage Vn0 immediately after the start of operation as the full-charge voltage Vs (=Vn0), as shown in FIG. 7B, even if the voltage at point a, up until which there is a sudden drop, is lower than the normal full-charge voltage, this point is taken as the 100% full-charge voltage Vs (Vn0).

Therefore, with the battery at a low temperature, even if the characteristics are such that the capacity is lower than at a high temperature, immediately after the start of operation after completion of a full charge, the display is 100%, and excessive charging is not done. For example, regeneratively developed current is not used for charging.

Because the estimation voltage Vn0 immediately after the start of operation is taken as the full-charge voltage Vs, as shown in FIG. 7B, using residual capacity characteristics A, which exhibit a linear decrease from the full-charge voltage Vs (Vn0) as a peak, it is possible to determine the residual capacity SOC from the subsequent battery estimation voltage Vn, making it possible to accurately determine the residual capacity uninfluenced by the temperature, without using a temperature sensor.

Figure 8:
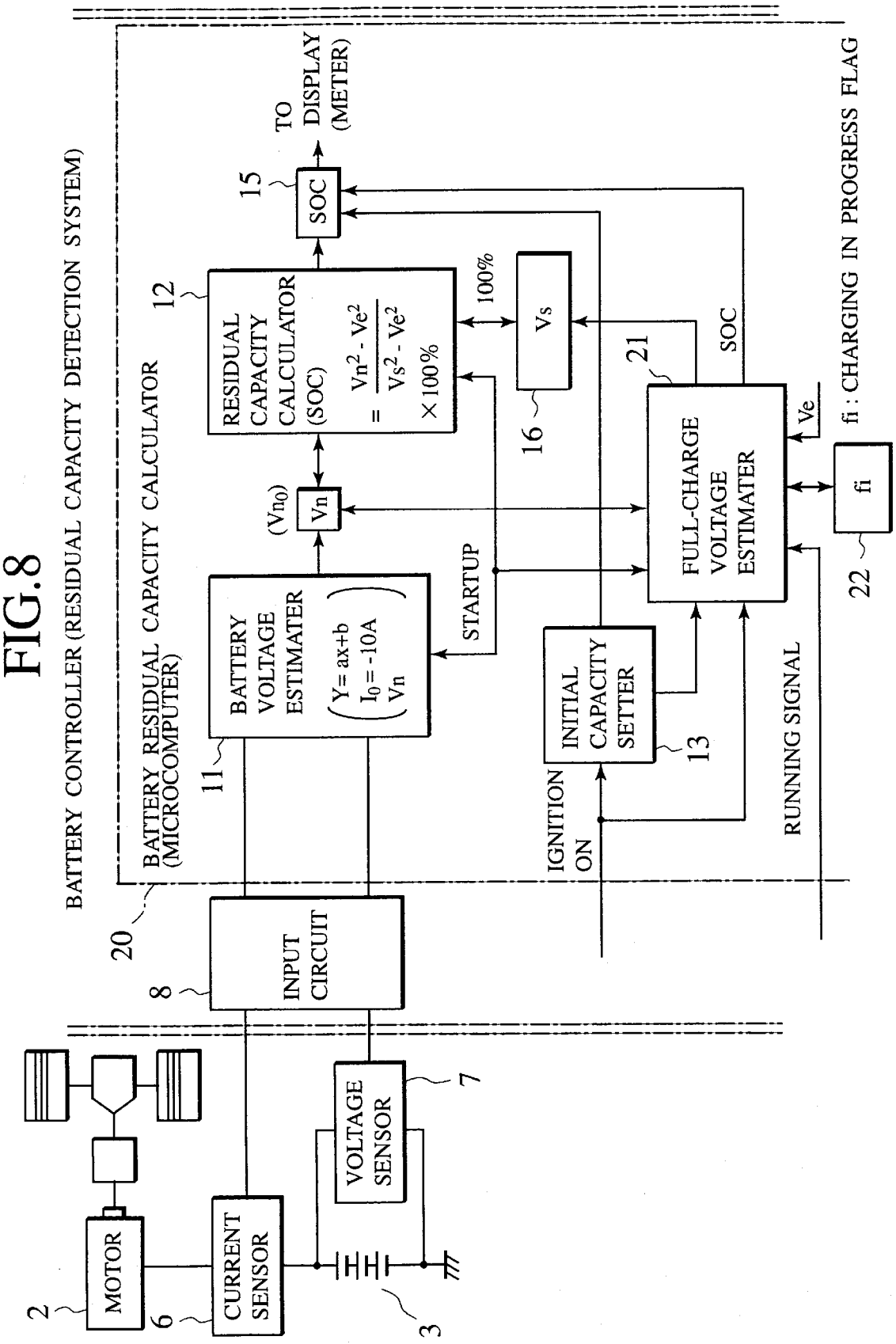
FIG. 8 is a drawing showing the general configuration of a battery residual capacity detection system according to a second embodiment of the present invention during charging.

FIG. 8 shows the general configuration of a battery controller according to a second embodiment of the present invention. A battery residual capacity calculator 20 using in the battery controller of FIG. 8 has in addition to a battery voltage estimator 11, a residual capacity calculator 12, an initial capacity setter 14, and a full-charge voltage corrector 14 (not shown in the drawing) according to the first embodiment, a full-charge voltage estimator 21, and accurately calculates the residual capacity when charging is stopped midway and the residual capacity at that point is used to start running.

When the switching on of the ignition, the start of running, and the setting of the charging-in-progress flag in the register 22 are detected, the full-charge voltage estimator 21 estimates the full-charge voltage Vs from the estimation voltage Vn determined by the battery voltage estimator 11, and sets this estimated full-charge voltage Vs into the register 16.

Figure 10A:
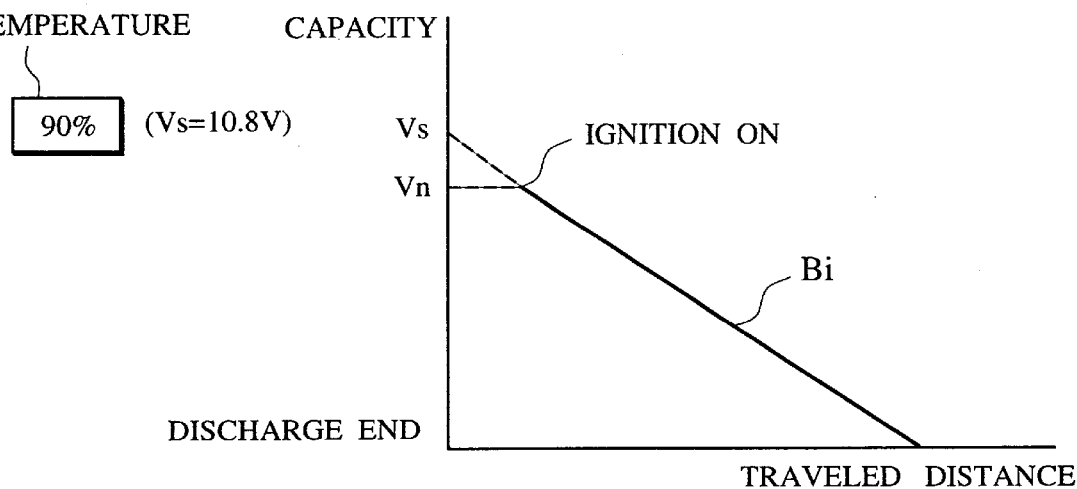
FIG. 10A and FIG. 10B are drawings illustrating the operation of the second embodiment.

That is, as shown in FIG. 10A, even if running is started with only a partial charge, the battery residual capacity variation with temperature is taken into consideration in estimating the full-charge voltage in the full-charge condition at that temperature.

Figure 9:
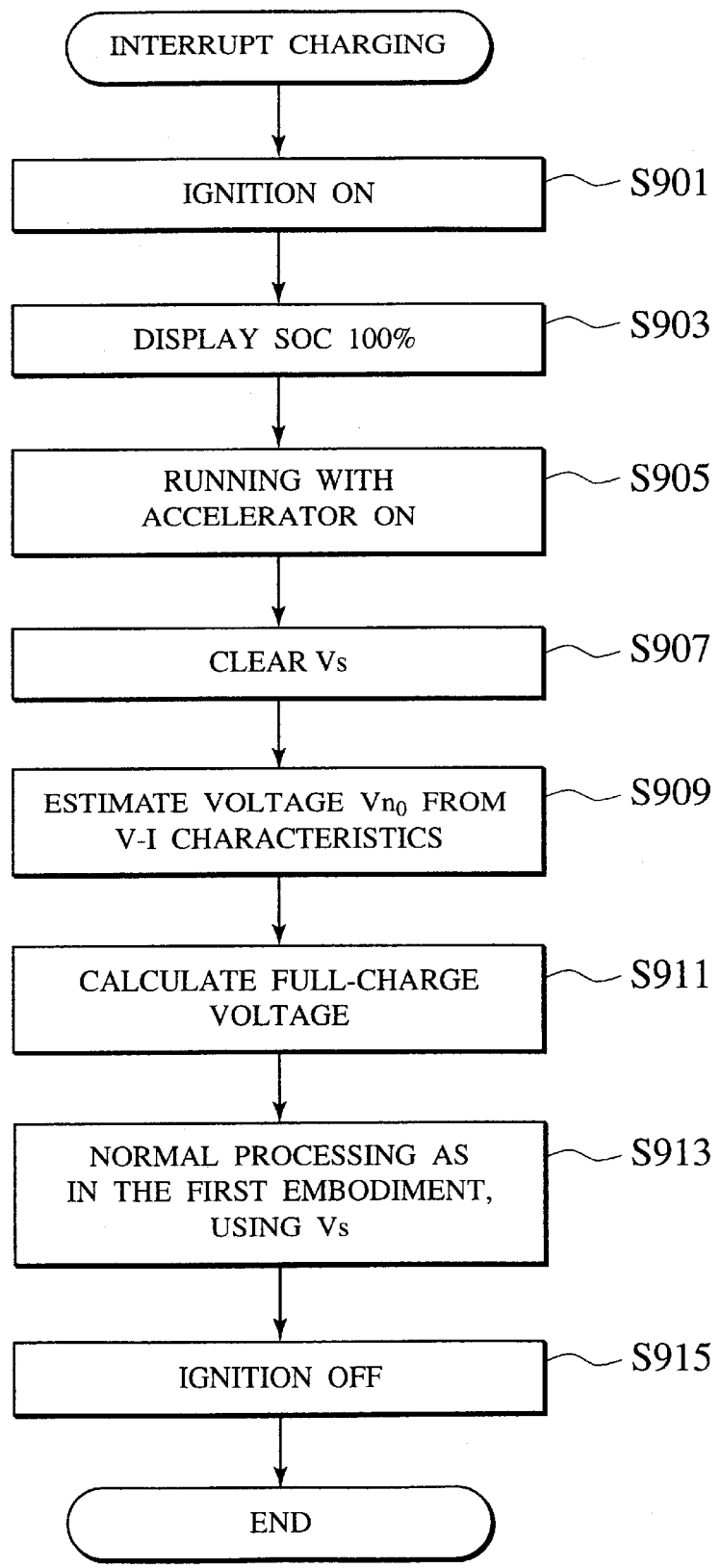
FIG. 9 is a flowchart illustrating the operation of the second embodiment.

The operation of this embodiment is described below, with reference made to the flowchart of FIG. 9. In the second embodiment, that the charging in still in progress is detected by the full-charge voltage estimator 21.

With the switching on of the ignition (step S901), the initial residual capacity setter 13 of the residual capacity calculator 20 mounted in an electrical vehicle immediately displays the initial residual capacity SOC as 100% (step S903).

Next, with running by operation of the accelerator (S905), the full-charge voltage estimator 21 clears the full-charge voltage Vs set in the register 16 (step S907).

Next, the battery voltage estimator 11 collects and averages a prescribed number of current I and voltage V values and, when a prescribed number of averaged data has been collected, determines the correlation coefficient r therefrom.

If the value of r indicates a strong negative correlation, the method of least squares is applied to determine a regression line, and from this linear approximation Y (Y=aX+B) and a reference current lo, the current battery voltage Vn (hereinafter called the estimation voltage Vn0) is estimated (step S909).

If running on a partial charge is detected, the full-charge voltage estimator 21 of the second embodiment uses the initial residual capacity (100%) set at step S903, the estimation voltage Vn0 immediately after the start of operation determined at step S909, and a pre-established discharge-end voltage Ve to determine the full-charge voltage Vs, according to equation 3, and sets this into the register 15 (step S911).

$$Vs=v[((Vn-Ve)/SOC)+Ve] \qquad (3),$$

where Vn is the estimated battery voltage, Ve is the discharge-end voltage, and Vs is the full-charge voltage.

Next, the residual capacity calculator 12 uses this estimated full-charge voltage Vs to perform the normal residual capacity calculations indicated by equation 2, until the ignition is switched off.

That is, as shown in FIG. 10A, if the full-charge voltage Vs when charging is interrupted midway is 10.8 V (with a full-charge voltage of, for example, 12.0 V at the reference temperature), capacity characteristics Bi, having a peak residual capacity of 90% are obtained, from which it is possible to accurately determine the residual capacity, even if the charging is interrupted midway, because the residual capacity is calculated.

Figure 10B:
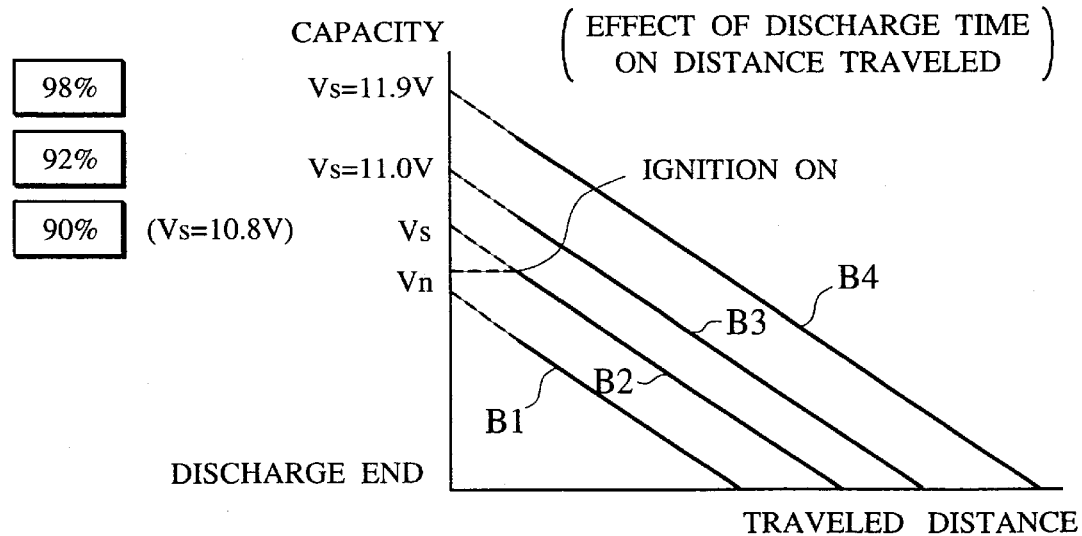
Figure 11:
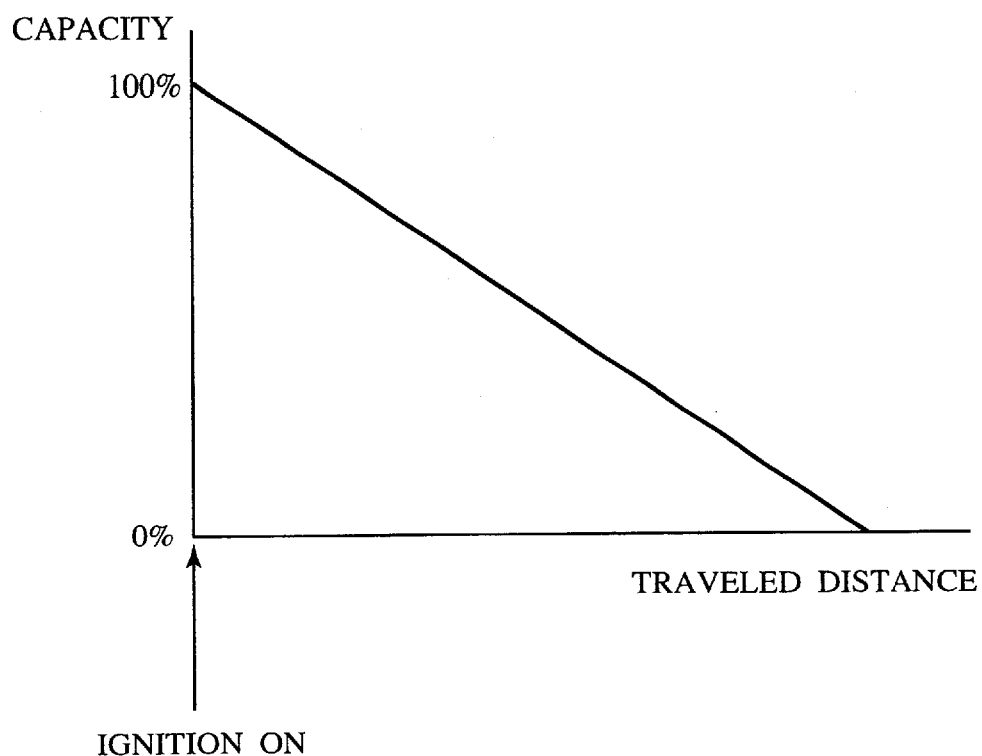
FIG. 11 is a drawing illustrating the battery residual capacity characteristics in the second embodiment.
Figure 12:
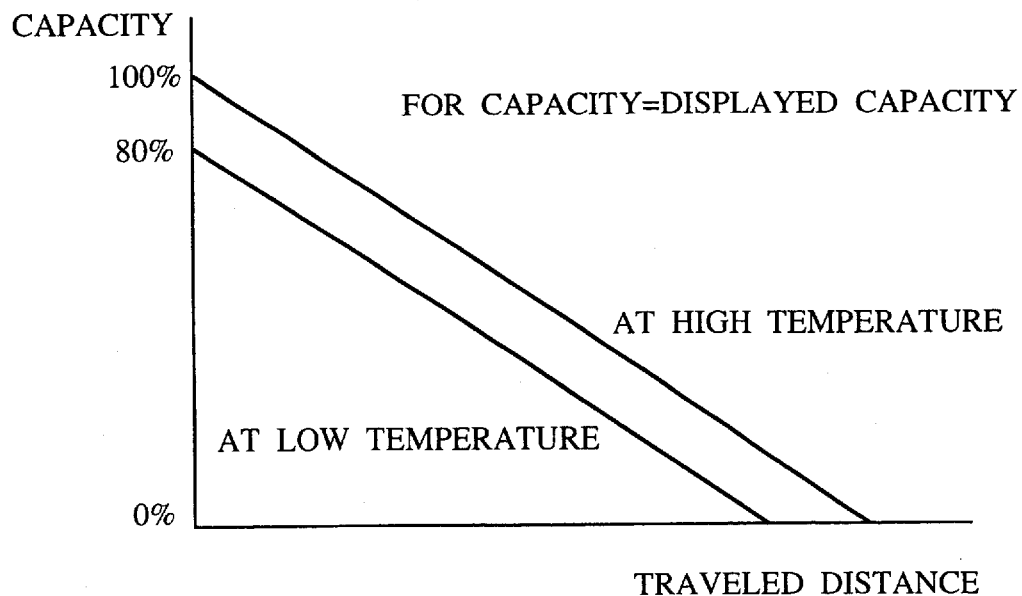
FIG. 12 is a drawing illustrating the battery residual capacity at high and low temporaries.
Figure 13:
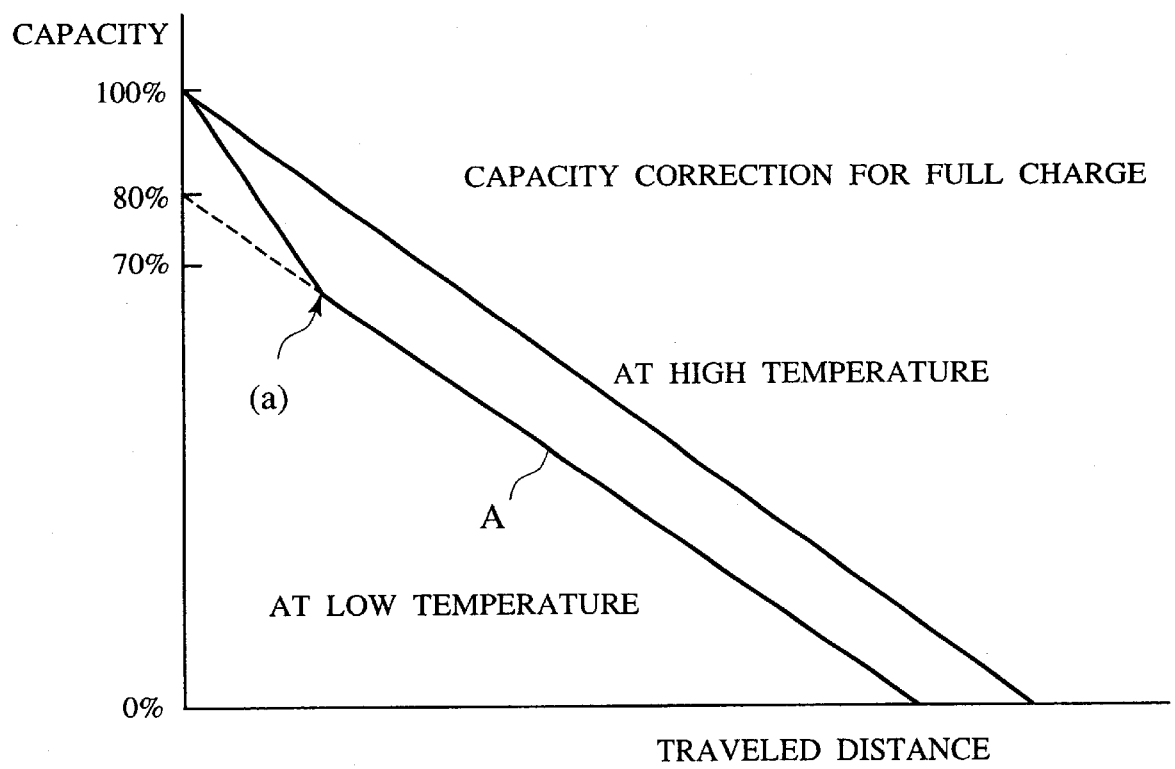
FIG. 13 is a drawing illustrating the problems solved by the present invention.

If the estimated full-charge voltage Vs is calculated as 11.9 V, 11 V, and 10.8 V, for example, the capacity characteristics Bi are as shown in FIG. 10B.

According to the present invention as described in detail below, after an initial residual capacity immediately after turning the power supply to on is taken as 100%, the full-charge voltage is taken as the battery voltage immediately after a change in the load, from which full-charge voltage (estimated battery voltage immediately after a change), the residual capacity immediately after the change is determined, so that immediately after a change the maximum capacity of 100% is displayed, after which with running the residual capacity- gradually decreases from the maximum capacity of 100%.

For this reason, even with temperature-related variations in the residual capacity of the battery, because the residual capacity is determined by the full-charge voltage when the variation occurs, it is possible to achieve an accurate determination of the residual capacity which takes into consideration the influence of temperature, so that excessive charging does not occur, even if the temperature drops.

If charging is interrupted midway, after which the load is varied, the full-charge voltage estimator estimates a full-charge voltage responsive to the estimation voltage immediately after the change, so that even if running is done on a partial charge, it is possible to obtain an full-charge voltage responsive to the estimation voltage, thereby enabling accurate detection of the residual capacity.

While preferred embodiments of the invention have been described using specific terms, such description is for illustrative purposes, and it is to be understood that changes and variations may be made without departing from the spirit or scope of the following claims.

What is claimed is:

1. A battery residual capacity detection system comprising:
    a calculator for estimating a battery voltage from a linear approximation representing a relationship between a terminal voltage of the battery, detected by a voltage detector, and a current flowing in a load from the battery, detected by a current sensor, and a reference current, and determining the residual capacity of the battery from this estimation voltage, a full-charge voltage, and a discharge-end voltage, the calculator comprising a full-charge voltage corrector for reading, immediately after a change in the load, the obtained estimation voltage, changing the full-charge voltage to the estimation voltage, and determining the residual capacity.

2. A battery residual capacity detection system according to claim 1, further comprising:
    an initial residual capacity setter that, immediately after a change in the load, causes a display of a residual capacity at a maximum capacity corresponding to a full-charge voltage at a reference temperature.

3. A battery residual capacity detection system according to claim 1, wherein a calculation of a residual capacity from the estimation voltage is performed by:
    a battery voltage estimator for collecting and averaging a prescribed number of voltages and currents and, if the averaged data indicates strong correlation, determining a linear approximation of the averaged data, and estimating the battery voltage from this linear approximation and a reference current, and
    a residual capacity calculator which, each time the estimation voltage is determined, uses a set full-charge voltage and discharge-end voltage to determine the overall capacity at the full-charge voltage, and determines the battery capacity at the point at which the estimation voltage is calculated, from the estimation voltage and a discharge-end voltage, this capacity and the overall capacity being used to determine the residual capacity.

4. A battery residual capacity detection system according to claim 1, wherein the full-charge voltage corrector, when notified that the battery has been fully charged, deletes a set full-charge voltage immediately after a change in the load, after which it is set to the estimation voltage immediately after the change.

5. A battery residual capacity detection system comprising:
    a calculator for estimating a battery voltage from a linear approximation representing a relationship between a terminal voltage of the battery, detected by a voltage detector, and a current flowing in a load from the battery, detected by a current sensor, and a reference current, and determining the residual capacity of the battery from this estimation voltage, a full-charge voltage, and a discharge-end voltage, the calculator comprising a full-charge voltage corrector for reading, immediately after a change in the load, the obtained estimation voltage, changing the full charge voltage to the estimation voltage, and determining the residual capacity; and
    a full-charge voltage estimator that, immediately after a change in the load, deletes a set full-charge voltage immediately after a change in the load, after which it reads the estimation voltage obtained immediately after the change and a set maximum residual capacity, this maximum residual capacity, the estimation voltage determined immediately after the change in the load, and a discharge-end voltage being used to estimate the full-charge voltage, the estimated full-charge voltage being then set as the new full-charge voltage.

6. A battery residual capacity detection system according to claim 5, wherein the full-charge voltage estimator estimates the full-charge voltage when charging of the battery is interrupted midway and the load varies.

7. A battery residual capacity detection system comprising:
    a calculator for estimating a battery voltage from a linear approximation representing a relationship between a terminal voltage of the battery, detected by a voltage detector, and a current flowing in a load from the battery, detected by a current sensor, and a reference current, and determining the residual capacity of the battery from this estimation voltage, a full-charge voltage, and a discharge-end voltage, the calculator comprising a full-charge voltage corrector for reading, immediately after a change in the load, the obtained estimation voltage, changing the full charge voltage to the estimation voltage, and determining the residual capacity; and
    an initial residual capacity setter that, immediately after a change in the load, causes a display of a residual capacity at a maximum capacity corresponding to a full-charge voltage at a reference temperature.

* * * * *

UNITED STATES PATENT AND TRADEMARK OFFICE
CERTIFICATE OF CORRECTION

PATENT NO. : 6,310,462 B1
DATED : October 30, 2001
INVENTOR(S) : Youichi Arai

It is certified that error appears in the above-identified patent and that said Letters Patent is hereby corrected as shown below:

<u>Title page,</u>
Item [57], ABSTRACT,
Line 6, "Vno" should read -- Vn0 --.

Signed and Sealed this

Twenty-third Day of July, 2002

*Attest:*

*Attesting Officer*

JAMES E. ROGAN
*Director of the United States Patent and Trademark Office*